United States Patent
Boehm et al.

(10) Patent No.: US 9,116,175 B2
(45) Date of Patent: Aug. 25, 2015

(54) ELECTRICAL TESTING APPARATUS FOR TESTING AN ELECTRICAL TEST SAMPLE AND ELECTRICAL TESTING METHOD

(75) Inventors: Gunther Boehm, Nufringen (DE); Berislav Kopilas, Althengstett (DE); Sylvia Ehrler, Boeblingen (DE); Michael Holocher, Rottenburg (DE)

(73) Assignee: FEINMETALL GMBH (DE)

( * ) Notice: Subject to any disclaimer, the term of this patent is extended or adjusted under 35 U.S.C. 154(b) by 885 days.

(21) Appl. No.: 13/356,991

(22) Filed: Jan. 24, 2012

(65) Prior Publication Data

US 2012/0119774 A1    May 17, 2012

Related U.S. Application Data

(62) Division of application No. 12/506,822, filed on Jul. 21, 2009, now Pat. No. 8,217,675.

(30) Foreign Application Priority Data

Jul. 26, 2008    (DE) .............................. 2008 034 918

(51) Int. Cl.
G01R 31/00 (2006.01)
G01R 1/073 (2006.01)
G01R 31/28 (2006.01)

(52) U.S. Cl.
CPC ........ G01R 1/07378 (2013.01); G01R 31/2886 (2013.01); G01R 1/07357 (2013.01)

(58) Field of Classification Search
None
See application file for complete search history.

(56) References Cited

U.S. PATENT DOCUMENTS

| | | | |
|---|---|---|---|
| 7,129,723 B2 * | 10/2006 | Bohm | 324/755.11 |
| 7,164,280 B2 | 1/2007 | Bohm | 324/761 |
| 2003/0099097 A1 | 5/2003 | Mok et al. | 361/767 |
| 2005/0264315 A1 | 12/2005 | Bohm | 324/763 |
| 2005/0275418 A1 | 12/2005 | Chong et al. | 324/758 |
| 2006/0255814 A1 | 11/2006 | Eldridge et al. | 324/754 |
| 2007/0128075 A1 | 6/2007 | Bohm | 422/68.1 |
| 2007/0145988 A1 | 6/2007 | Garabedian et al. | 324/754 |
| 2007/0229102 A1 * | 10/2007 | Eldridge et al. | 324/754 |
| 2008/0074130 A1 | 3/2008 | Kuo et al. | |

FOREIGN PATENT DOCUMENTS

| | | |
|---|---|---|
| DE | 602 18 825 | 12/2007 |
| EP | 1 364 221 | 11/2003 |
| EP | 1 391 738 | 2/2004 |

(Continued)

OTHER PUBLICATIONS

Chinese Office Action dated Dec. 19, 2013 in corresponding Chinese Patent Application No. 201210054097.5 (with English language translation).

(Continued)

*Primary Examiner* — Minh N Tang
(74) *Attorney, Agent, or Firm* — Ostrolenk Faber LLP

(57) ABSTRACT

An electrical testing apparatus for testing an electrical test sample. The apparatus includes a conductor substrate which is electrically connected via a contact spacing converter to a test head. The conductor substrate is mechanically connected to a first stiffening device and is thereby stiffened. At least one spacer which penetrates the conductor substrate is mechanically connected to the contact spacing converter and is held on the first stiffening device via at least one tilt adjusting arrangement.

13 Claims, 8 Drawing Sheets

(56) References Cited

FOREIGN PATENT DOCUMENTS

| | | |
|---|---|---|
| EP | 1 600 781 | 11/2005 |
| EP | 1 785 733 | 5/2007 |
| JP | 2000-338134 | 12/2000 |
| JP | 2005-338061 | 12/2005 |
| JP | 2007-155735 | 6/2007 |
| TW | 200816339 A | 4/2008 |
| WO | WO 2006/086512 | 8/2006 |
| WO | WO 2006/129971 | 12/2006 |
| WO | 2007/050865 | 5/2007 |
| WO | 2007/081421 | 7/2007 |

OTHER PUBLICATIONS

Taiwan IPO Search Report dated Mar. 12, 2014 in corresponding Taiwanese Patent Application No. 101112772 (with English language translation).
European Search Report dated Feb. 7, 2013.
European Search Report dated Feb. 4, 2013.
Japan Office Action dated Nov. 27, 2012.
Chinese Office Action dated Feb. 16, 2013 and English translation.
Search and Examination Report dated Jan. 15, 2010.
English translation of Chinese Office Action dated Oct. 10, 2011.
U.S. Office Action dated Nov. 18, 2011 issued in parent U.S. Appl. No. 12/506,822.

* cited by examiner

ELECTRICAL TESTING APPARATUS FOR TESTING AN ELECTRICAL TEST SAMPLE AND ELECTRICAL TESTING METHOD

CROSS REFERENCE TO RELATED APPLICATIONS

The present application is a divisional of U.S. Pat. No. 8,217,675, issued on Jul. 10, 2012, which claims priority of German Patent Application No. 2008 034 918.6, filed Jul. 26, 2008, the entire contents of which are hereby incorporated by reference.

FIELD OF AND BACKGROUND OF THE INVENTION

The invention relates to an electrical testing apparatus for testing an electrical test sample, comprising a conductor substrate which is electrically connected via a contact spacing converter to a test head, wherein the conductor substrate is mechanically connected to a first stiffening device and is thereby rigidly secured.

An electrical testing apparatus of the aforementioned type is known. It is used for electrically contacting an electrical test sample, for example, a wafer. This involves physical contacting, by means of which the electrical circuits are connected to a testing apparatus which tests the electrical functioning of the test samples. In this way, functioning test samples can be distinguished from non-functioning test samples. The known electrical testing apparatus comprises a conductor substrate which is electrically connected, via a contact spacing converter, to a test head. Contact pins of the test head are electrically connected to the contact spacing converter and serve to contact the test sample. The conductor substrate is connected to the aforementioned testing apparatus. Since, due to ever increasing integration density, the contact spacings of the test sample are extremely small, in order to increase the wiring density that can be tested, the contact spacing converter is provided between the contact head and the conductor substrate, wherein the contact spacing converter transforms the small contact spacings of the contact pins of the test head to larger contact spacings. The larger contact spacings correlate to equally sized contact spacings on the conductor substrate and the conductor substrate preferably brings about a further contact spacing enlargement wherein, finally, the contacts of the conductor substrate having this larger contact spacing are connected by means of suitable cable connections or the like to the testing apparatus.

OBJECTS OF THE INVENTION

Since therefore at least one assembly necessary for the electrical connection is situated between the conductor substrate and the contact head, an orientation of the components involved that is sufficient to provide contact is not always achieved, so that the functional capability of an electrical testing apparatus of this type is uncertain. In this regard, it is noteworthy that the contact head is only in physical electrical contact with the contact spacing converter and the contact spacing converter is only in physical electrical contact with the conductor substrate.

It is therefore an object of the invention to provide an electrical testing apparatus for testing an electrical test sample which has a high degree of contact reliability and functional reliability, so that testing an electrical test sample can be carried out without error.

SUMMARY OF THE INVENTION

These and other objects are achieved, according to one formulation of the invention and using the aforementioned features, in that at least one spacer which penetrates the conductor substrate is mechanically connected to the contact spacing converter and is held on the first stiffening device by at least one tilt adjusting arrangement. The physical contacting forces acting on the conductor substrate can have a large value in total given a high test contact density. In order to avoid mechanical deformation of the conductor substrate by these contact forces, the first stiffening device is assigned to the conductor substrate. For fault-free physical electrical contact between the contact head and the conductor substrate—with the contact spacing converter and possibly further electrical connecting elements (connectors) arranged therebetween—the invention provides that the contact spacing converter (space transformer) is arranged adjustable for tilt relative to the conductor substrate. For this purpose, the tilt adjusting arrangement, which makes the tilt adjustment via at least one spacer which penetrates the conductor substrate and is mechanically connected to the contact spacing converter, is provided. In particular, a tilt element can be provided which is mechanically connected, via the at least one spacer which penetrates the conductor substrate, to the contact spacing converter and is held adjustable for tilt, by the tilt adjusting arrangement, on the first stiffening device. The stiffening device and the tilt element therefore constitute a rigid structure which is intrinsically formed by the spacer, wherein the conductor substrate is situated between these two parts. However, since the conductor substrate is penetrated by the at least one spacer, a tilt movement of the tilt plate leads, via the spacer, to a corresponding movement of the contact spacing converter, but without the position of the conductor substrate being changed thereby. The at least one spacer penetrates at least one aperture in the circuit board, preferably without physical contact. In order to be able to tilt the tilt element relative to the conductor substrate, the tilt element is held by the tilt adjusting arrangement at the first stiffening device, which in turn is undisplaceably connected to the conductor substrate. If the tilt element is tilted relative to the first stiffening device, this leads to a corresponding tilt movement of the contact spacing converter (also called space transformer) relative to the conductor substrate. Regardless of whether a particular embodiment of the invention has a tilt element or not, a reference surface on the contact spacing converter is adjusted for tilt relative to a reference surface on the conductor substrate. The contact spacing converter and the conductor substrate can thus be oriented relative to one another in the desired manner, so that good contact can be realized between the contact pins of the test head and the electrical test sample (wafer) while, at the same time, good contact with the conductor substrate—possibly with electrical connecting elements (connectors) interposed—can be ensured.

According to one development of the invention, it is provided that the spacer penetrates the first stiffening device. Thus the spacer reaches as far as the side of the first stiffening device facing away from the conductor substrate, so that the tilt adjusting arrangement can be provided there.

According to another development of the invention, it is provided that the conductor substrate has first contact surfaces which are connected via contact elements to counter-contact surfaces of the contact spacing converter. The contact elements in question constitute the aforementioned electrical connecting elements, which are also referred to as connectors. The contact elements are in physical contact with the first contact surfaces of the conductor substrate and also in physical contact with the countercontact surfaces of the contact spacing converter.

It is advantageous if the contact elements compensate for an angular offset between the conductor substrate and the contact spacing converter. For that purpose, the contact elements are configured flexible to the extent that, given a change in the tilt between the reference surface of the conductor substrate and the reference surface of the contact spacing converter, the contact elements maintain the physical contact with the first contact surface of the conductor substrate and the countercontact surfaces of the contact spacing converter.

Another development of the invention provides that the contact spacing converter has second contact surfaces which are in electrical contact with contact probes/contact pins, particularly buckling beams, of the test head. The test head preferably has guide plates lying at a distance from one another and having guide openings which are penetrated by the contact probes which are configured, in particular, as buckling beams. One end of the buckling beams comes into physical contact with the second contact surfaces of the contact spacing converter and the other end of the buckling beams makes physical contact with electrical contacts of the test sample. Thus, during electrical testing of the test sample, the testing apparatus and the test sample are moved toward one another in order to bring about the physical contacting of the test sample. Either the testing apparatus and the test sample move, or only one of these assemblies moves. The movement takes place in the longitudinal extent of the contact probes of the contact head. Since buckling beams are preferably used as the contact probes, they undergo length adjustment through buckling with respect to their longitudinal extent.

Another development of the invention provides that contact elements are firmly arranged at the contact spacing converter for physical electrical contacting of the test sample. Contrary to the aforementioned embodiment wherein the contact spacing transformer has second contact surfaces which come into physical contact with contact probes, which themselves are brought into physical electrical contact with the test sample, it is thus provided that the contact elements which bring about the contacting of the test sample are firmly arranged on the contact spacing converter. A preferably removable test head is then not provided.

It is also advantageous if, in an alternative embodiment, the contact elements are firmly arranged on the contact spacing converter. The contact elements are then directly associated with the contact spacing converter and held thereon. Alternatively, it is possible that the contact elements are elements of a separate assembly which is arranged between the conductor substrate and the contact spacing converter.

Another development of the invention provides a second stiffening device wherein the first stiffening device is arranged on one side of the conductor substrate and the second stiffening device is arranged on the other side of the conductor substrate. In this way, the conductor substrate is rigidly secured on both sides in that both the stiffening devices are mechanically connected to the conductor substrate. In particular, it can be provided that both stiffening devices are placed under tension and thereby accommodate the conductor substrate between them, particularly in clamping and supporting manner.

A preferred embodiment of the invention preferably provides that the contact spacing converter is associated with the second stiffening device. In particular, the second stiffening device has an opening in which the contact spacing converter is at least partially accommodated without physical contact. This arrangement enables the direct association of the second stiffening device to the conductor substrate and also brings about, by way of the opening, a close association of the contact spacing converter with the conductor substrate. In order to bring about a tilt movement of the contact spacing converter with the tilt element, the contact spacing converter must not lie against the second stiffening device. Due to the physical contact-free accommodation of the contact spacing converter in the opening of the second stiffening device, the tilt movement is not hindered.

For the aforementioned tilt adjustment, preferably a tilt adjusting arrangement in the form of threaded screws is provided. The threaded screws can be configured as adjusting screws and/or locking screws. The adjusting screws serve to bring about a suitable angular position of the tilt element to the first stiffening device and the locking screws serve to fix this angular position. For this purpose, the adjusting screws are adjustably screwed into the tilt element, wherein they rest with one end against the first stiffening device. The locking screws are screwed into the first stiffening device and lie with their heads against the tilt element in tensioning manner. The tilt adjustment can also be made by other arrangements. In particular, screws can be provided, under which a feeler gauge band (i.e., a special film which is available in very fine thickness grades) is laid. The special film is preferably made from steel or nickel silver.

The tilt element is preferably configured as a tilt plate. The conductor substrate is configured, in particular, as a circuit board. The first and/or second stiffening device preferably take the form of a slab.

According to another development of the invention, it is provided that the spacer comprises a spacing sleeve. This is fastened with one end thereof to the contact spacing converter and with the other end to the tilt element.

Preferably, an aligning device is provided which aligns the conductor substrate laterally to the contact spacing converter in order to position the first contact surfaces of the conductor substrate relative to the countercontact surfaces of the contact spacing converter, so that the contact elements (connectors) lying therebetween can connect respective mutually associated first contact surfaces to associated countercontact surfaces in electrically error-free manner.

According to another development of the invention, it can be provided that the tilt adjusting arrangement is arranged on the spacer. The tilt adjusting arrangement cooperates with the first stiffening device.

A plurality of spacers which are spaced apart from one another is preferably also provided.

The invention also relates to a method for electrical testing of an electrical test sample, in particular using the above testing apparatus, having a conductor substrate which is electrically connected via a contact spacing converter to a test head, wherein the conductor substrate is mechanically connected to a first stiffening device and is thereby stiffened, and wherein at least one spacer penetrating the conductor substrate is mechanically connected to the contact spacing converter and is held against the first stiffening device by the tilt adjusting arrangement.

Further advantageous embodiments of the method are disclosed by the claims.

These and other features of preferred embodiments of the invention are described in the claims as well as in the specification and the drawings. The individual features may be implemented either alone or in combination as embodiments of the invention, or may be implemented in other fields of application. Further, they may represent advantageous embodiments that are protectable in their own right, for which protection is claimed in the application as filed or for which protection will be claimed during pendency of the application.

BRIEF DESCRIPTION OF THE DRAWINGS

The invention as well as embodiments and advantages thereof are described below in greater detail, by way of example, with reference to the drawings in which.

DETAILED DESCRIPTION OF THE PREFERRED EMBODIMENTS

Figure 1:
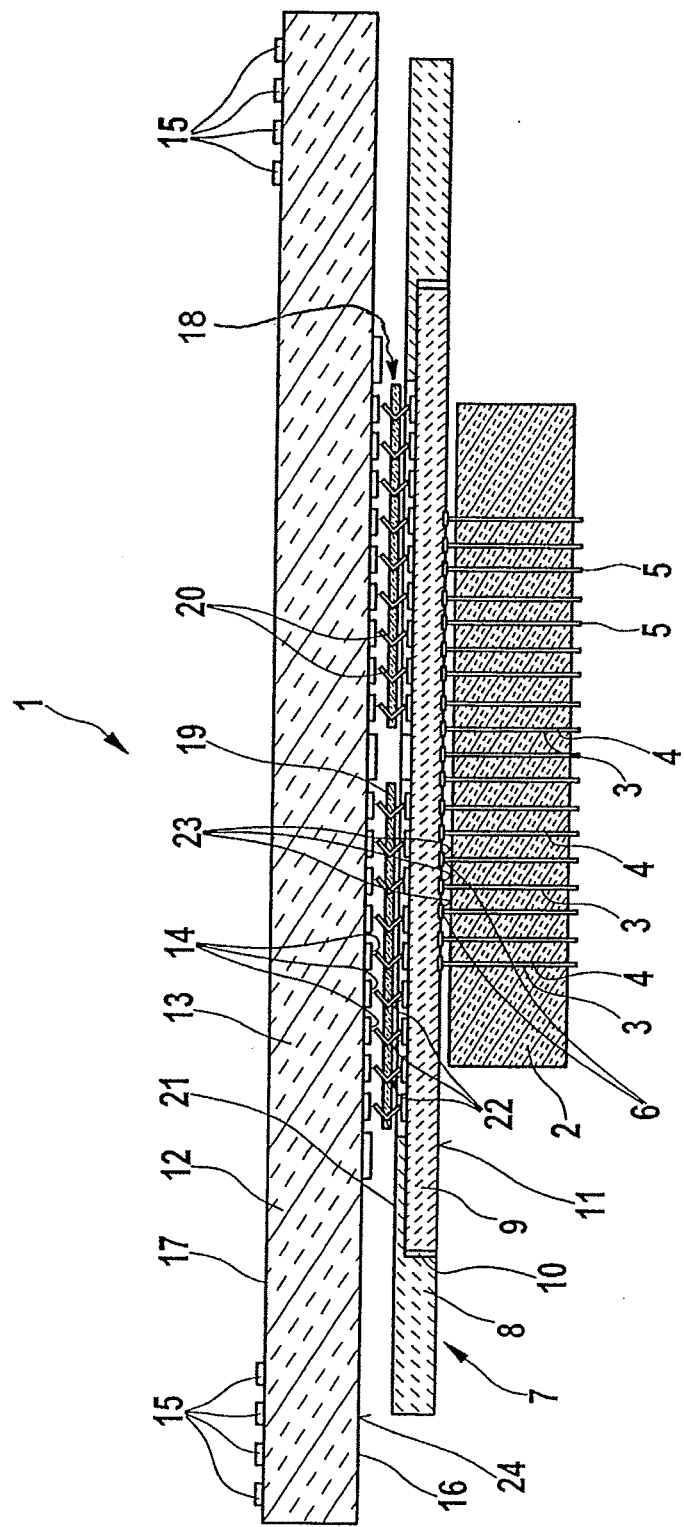
FIG. 1 shows a schematic longitudinal section through an electrical testing apparatus for testing an electrical test sample, although wherein the testing apparatus is not shown entirely with all the components.

FIG. 1 shows a testing apparatus 1, but not with all the components illustrated. The testing apparatus 1 has a contact head 2 (also referenced herein as test head 2), which has contact probes 4 displaceably mounted in guide bores 3, said contact probes 4 preferably being configured as buckling beams. The contact probes 4 have free ends 5 which can be physically contacted by contacts of an electrical test sample (not shown). For this purpose, the testing apparatus 1 is lowered onto the testing apparatus 1 or the test sample is brought to the testing apparatus 1 or both parts are moved toward one another. The other ends 6 of the contact probes 4 are in physical contact with a contact spacing converter 7, which has a support 8 and an electrical contact spacing conversion circuit 9. The support 8 is preferably configured as a metal support. The contact spacing conversion circuit 9 is firmly connected to the ceramic support 8. The support 8 has a receptacle 10 in which the contact spacing conversion circuit 9 is accommodated in sunken manner. The contact spacing converter 7 has a reference surface 11 on the side facing toward the contact head 2. A conductor substrate 12, in particular in the form of a circuit board 13, is arranged at a slight distance from the contact spacing converter 7. The circuit board 13 has first contact surfaces 14 which are in electrical contact with large surface contacts 15, wherein the first contact surfaces 14 are arranged on one side 16 and the large surface contacts 15 are arranged on the other side 17 of the conductor substrate 12. Arranged between the contact spacing converter 7 and the conductor substrate 12 are electrical contact elements 18 which have electrical contacts 20 on an insulating support 19. On the side 21 facing toward the conductor substrate 12, the contact spacing converter 7 has countercontact surfaces 22 arranged in the region of the contact spacing conversion circuit 9, said countercontact surfaces 22 being electrically connected via the contacts 20 to the first contact surfaces 14. In the region of the contact spacing conversion circuit 9, the contact spacing converter 7 has second contact surfaces 23 which are electrically connected to the countercontact surfaces 22. The ends 6 of the contact probes 4 lie in physical contact against the second contact surfaces 23.

From the standpoint of the test sample (not shown), the testing apparatus 1 has the following electrical paths, wherein, for the sake of simplicity, only one of these paths will be described here. The other paths correspond to the described path. On testing the electrical test sample, a contact present at the test sample comes into physical contact with the end 5 of one of the contact probes 4, the other end 6 of which is in physical contact with one of the second contact surfaces 23, which is wired inside the contact spacing conversion circuit 9 to one of the countercontact surfaces 22, against which one end of one of the contacts 20 is in physical contact, wherein the other end of the contact 20 lies in physical contact with one of the first contact surfaces 14 which is wired within the conductor substrate 12 to one of the large surface contacts 15. The large surface contact 15 is connected via an electrical line (not shown) to a testing apparatus. It is clear overall that electrical test current paths can be created between the testing apparatus and the test sample, in order to test the sample for faultless electrical function. The contact spacing of the contact probes 4 corresponds to the contact density of the test sample. The contact spacing converter 7 serves to change this compact contact spacing into a less compact contact spacing. This is shown in FIG. 1, the countercontact surfaces 22 there having a greater mutual separation than the second contact surfaces 23. The contact spacing of the first contact surfaces 14 is increased again by the conductor substrate 12 in that the contact spacing of the large surface contacts 15 is greater than that of the first contact surfaces 14.

In order to be able to align the reference surface 11 of the contact spacing converter 7 from being tilted relative to a reference surface 24 of the conductor substrate 12, a tilt device 25 (FIG. 2) is provided. The reference surface 24 of the conductor substrate 12 corresponds to the side 16 of this component.

Figure 2:
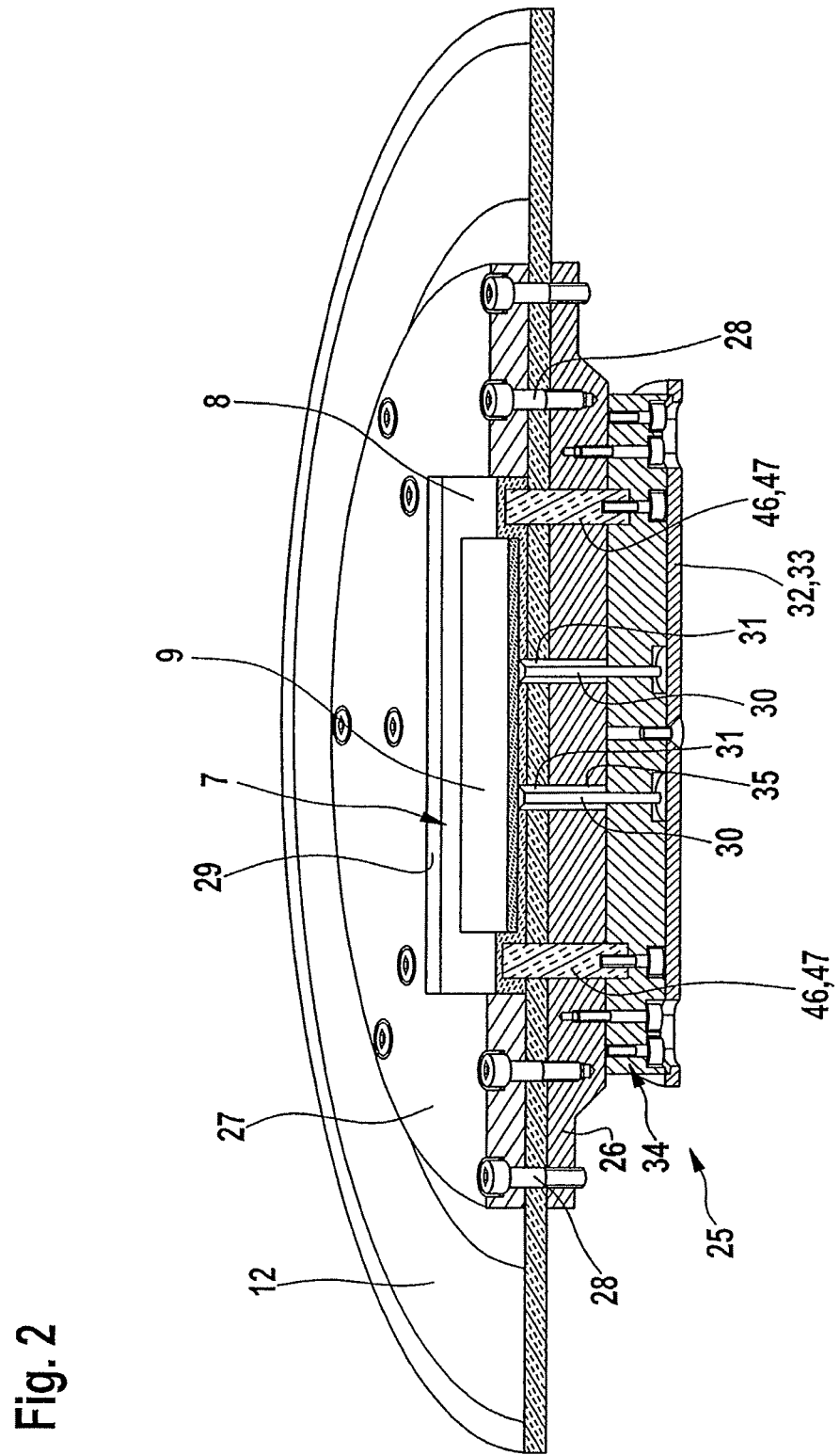
FIG. 2 shows a perspective longitudinal section through the testing apparatus of FIG. 1 without showing a contact head.

FIG. 2 shows the arrangement of FIG. 1 again, although the contact head 2 and the contact elements 18 are not drawn in and the region of the testing apparatus 1 facing downwardly in FIG. 1, faces upwardly in FIG. 2. It is also apparent from FIG. 2 that a first stiffening device 26 and a second stiffening device 27 are associated with the conductor substrate 12. The first stiffening device 26 is in contact with the side 17 of the conductor substrate 12. The second stiffening device 27 is arranged on the side 16 of the conductor substrate 12. The two stiffening devices 26 and 27 are tensioned against one another with tensioning elements 28 so that they accommodate the conductor substrate 12 in clamping manner between them and thereby rigidly secure the conductor substrate.

The second stiffening device 27 has an accommodating opening 29 in which the contact spacing converter 7 is accommodated without physical contact. The contact spacing converter 7 is held there by a plurality of spacers 30 which penetrate apertures 31 of the conductor substrate 12 without physical contact and extend as far as a tilt element 32. The tilt element 32 is configured, in particular, as a tilt plate 33. The tilt element 32 is tiltably connected via the tilt adjusting arrangement 34 to the first stiffening device 26. The spacers 30 penetrate apertures 35 of the first stiffening device 26 without physical contact.

Figure 3:
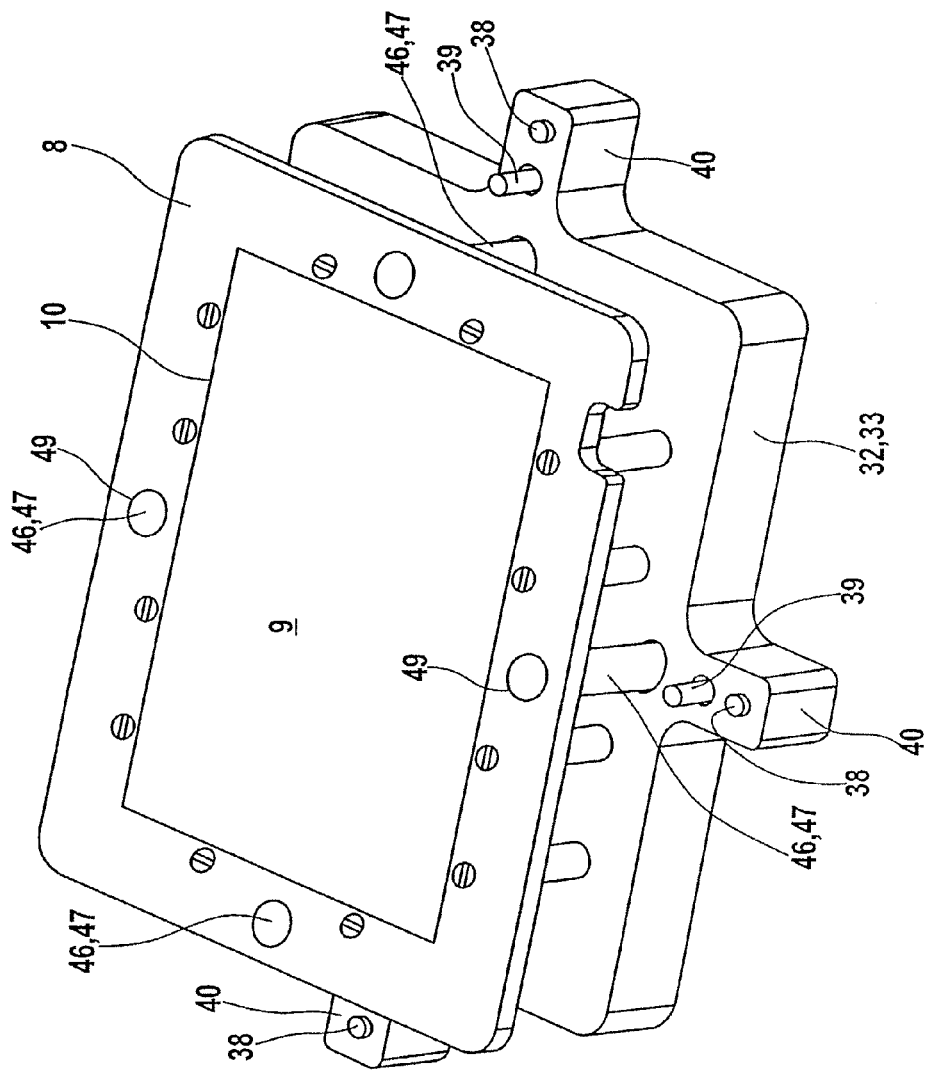
FIG. 3 shows a perspective view of a contact spacing converter and a tilt element of the testing apparatus.
Figure 4:
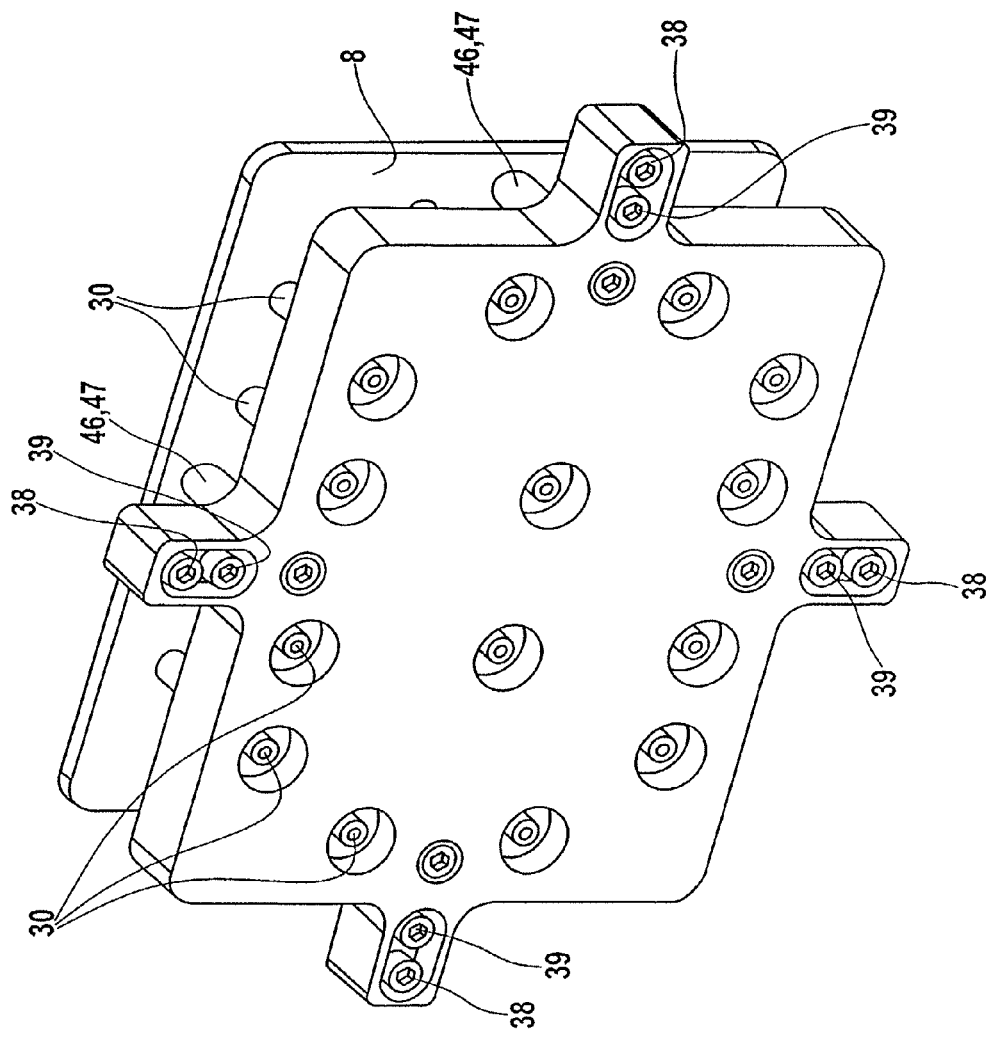
FIG. 4 shows a perspective view of the arrangement of FIG. 3, but from another viewing angle.
Figure 5:
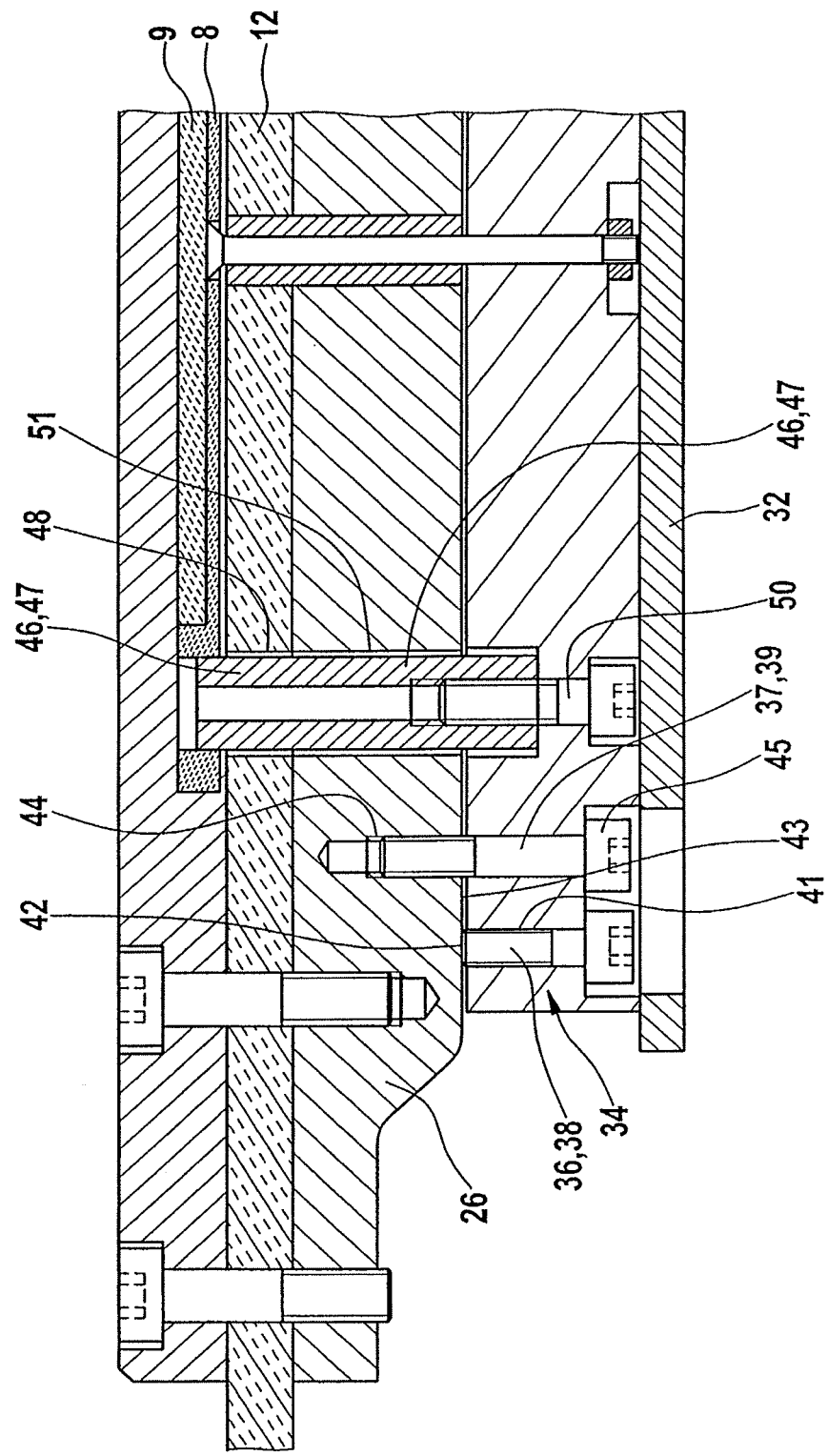
FIG. 5 shows a longitudinal section through a region of the electrical testing apparatus without showing the contact head.

The structure of the tilt adjusting arrangement 34 is clearly recognizable from FIG. 5. The tilt adjusting arrangement 34 has threaded screws 36 and 37 wherein the threaded screws 36 are configured as adjusting screws 38 and the threaded screws 37 are configured as locking screws 39. It is apparent from FIGS. 3 and 4 that the tilt element 32 has a plurality of adjusting screws 38 and locking screws 39 arranged spaced apart from one another, wherein one adjusting screw 38 and one locking screw 39 adjoin one another in each case. In the exemplary embodiment shown in FIGS. 3 and 4, the tilt element 32 is configured as a rectangular tilt plate 33 which includes, in the region of each of the four sides thereof, a projection 40 with which an adjusting screw 38 and a locking screw 39 are associated.

The arrangement is made such that—according to FIG. 5—each of the adjusting screws 38 is adjustably screwed with the thread thereof into a threaded bore 41 of the tilt element 32 and rests with one end 42 thereof against an outer side 43 of the first stiffening device 26. The associated locking screw 39 is screwed into a threaded bore 44 of the first stiffening device 26 and lies with the head 45 of said locking screw 39 in tensioning manner against the tilt element 32. The locking screw 39 therefore pulls the tilt element 32 in the direction toward the first stiffening device 26 so that the end 42 of the adjusting screw 38 is pressed against the outside 43 of the first stiffening device 26. It is clear from this that the spacing position of the tilt element 32 from the first stiffening device 26 can be adjusted depending on the projecting length, that is the screwing-in depth, of the adjusting screws 38. Since a plurality of pairs of adjusting screws 38 and locking screws 39 is provided, the position of the tilt element 32 with regard to the tilt thereof relative to the first stiffening device 26 can be adjusted to a desired position with the tilt adjusting arrangement 34. Since the tilt element 32 is rigidly coupled via the spacer 30 to the contact spacing converter 7, when the tilt of the tilt element 32 is adjusted, the position, and in particular also the tilt position of the contact spacing converter 7 is altered. It follows therefrom that the reference surface 11 of the contact spacing converter 7 is adjustable relative to the reference surface 24 of the conductor substrate 12 through the tilt adjusting arrangement 34.

Furthermore, in FIGS. 2 to 5, aligning devices 46 in the form of alignment pins 47 are shown, which serve for lateral alignment of the conductor substrate 12 relative to the contact spacing converter 7. This alignment is also known as registration and ensures that the first contact surfaces 14 are aligned in the desired manner to the countercontact surfaces 22 in the direction of extension of the plane of the circuit board 13. For this purpose, the rod-shaped aligning devices 46, which are preferably non-round, and particularly oval in cross-section, engage in corresponding guide apertures 48 in the conductor substrate 12 and guide apertures 49 in the contact spacing converter 7. The aligning devices 46 are fixed by fastening screws 50 to the tilt element 32. These guide apertures 48 and 49 constitute passageways for the rod-shaped aligning devices 46. The aligning devices 46 penetrate apertures 51 of the first stiffening device 26 without physical contact.

It follows therefrom that, due to the spacers 30, which are preferably configured as spacing sleeves, a defined spacing is assured between the contact spacing converter 7 and the tilt element 32. The contact spacing converter 9 is preferably unreleasably connected to the support 8, preferably cemented. In particular, the four adjusting screws 38 press with their ends 42 against the first stiffening device 26, which is also known as a backstiffener. Using these four adjusting screws 38, therefore, the spacing between the tilt element 32 and the first stiffening device 26 can be adjusted. Since the first stiffening device 26 is firmly connected to conductor substrate 12 and the tilt element 32 is affixed to the contact spacing converter 7, the adjusting screws 38 can also be used to adjust/set the angle of the reference surface 11 of the contact spacing converter 7 and of the reference surface 24 of the conductor substrate 12. Following setting of the angle between said reference surfaces 11 and 24, the procedure is completed by tightening the locking screws 39. Having been adjusted relative to one another, the reference surfaces 11 and 24 are thereby fixed.

Figure 6:
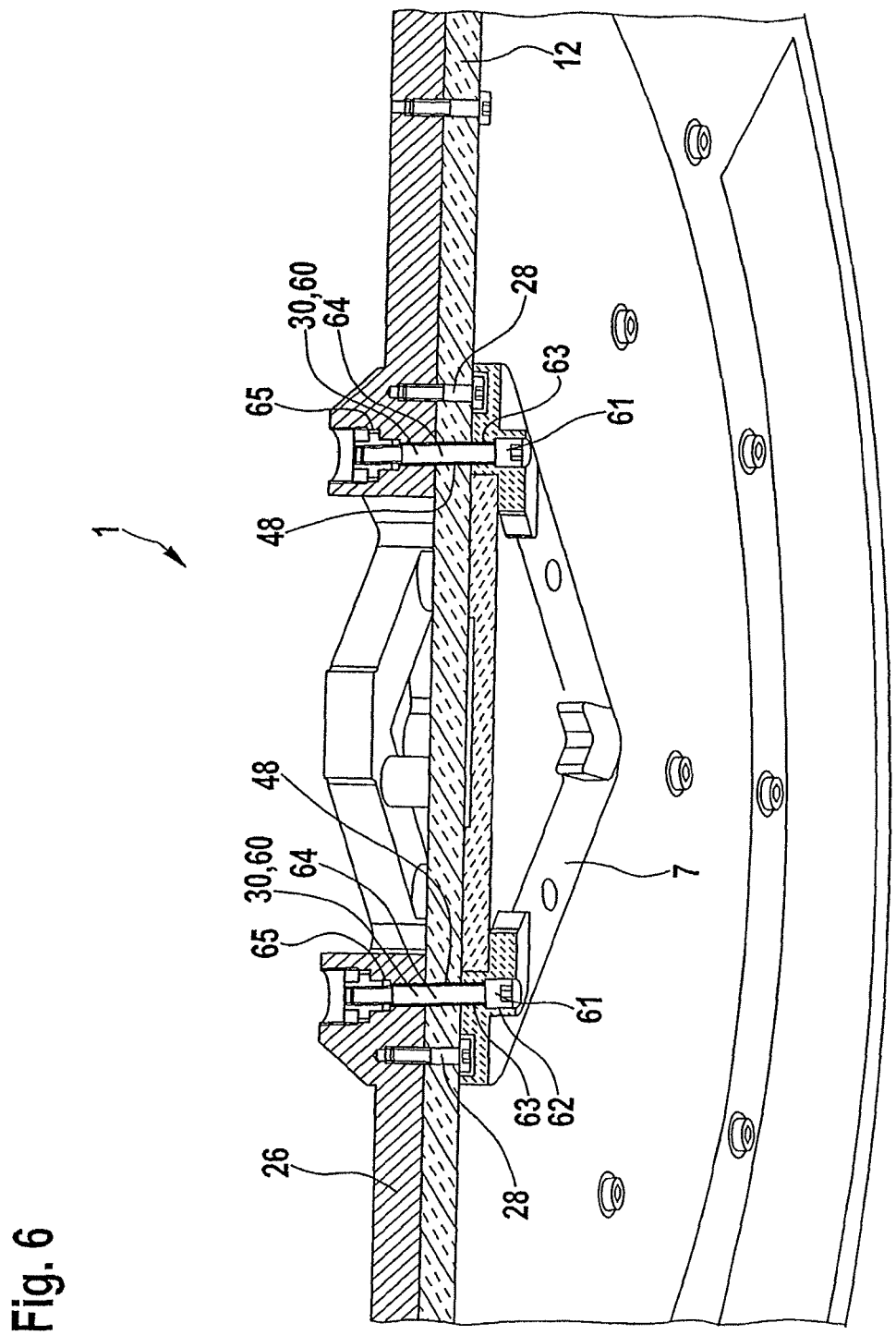
FIG. 6 shows a perspective longitudinal section through a region of an electrical testing apparatus according to another exemplary embodiment.
Figure 7:
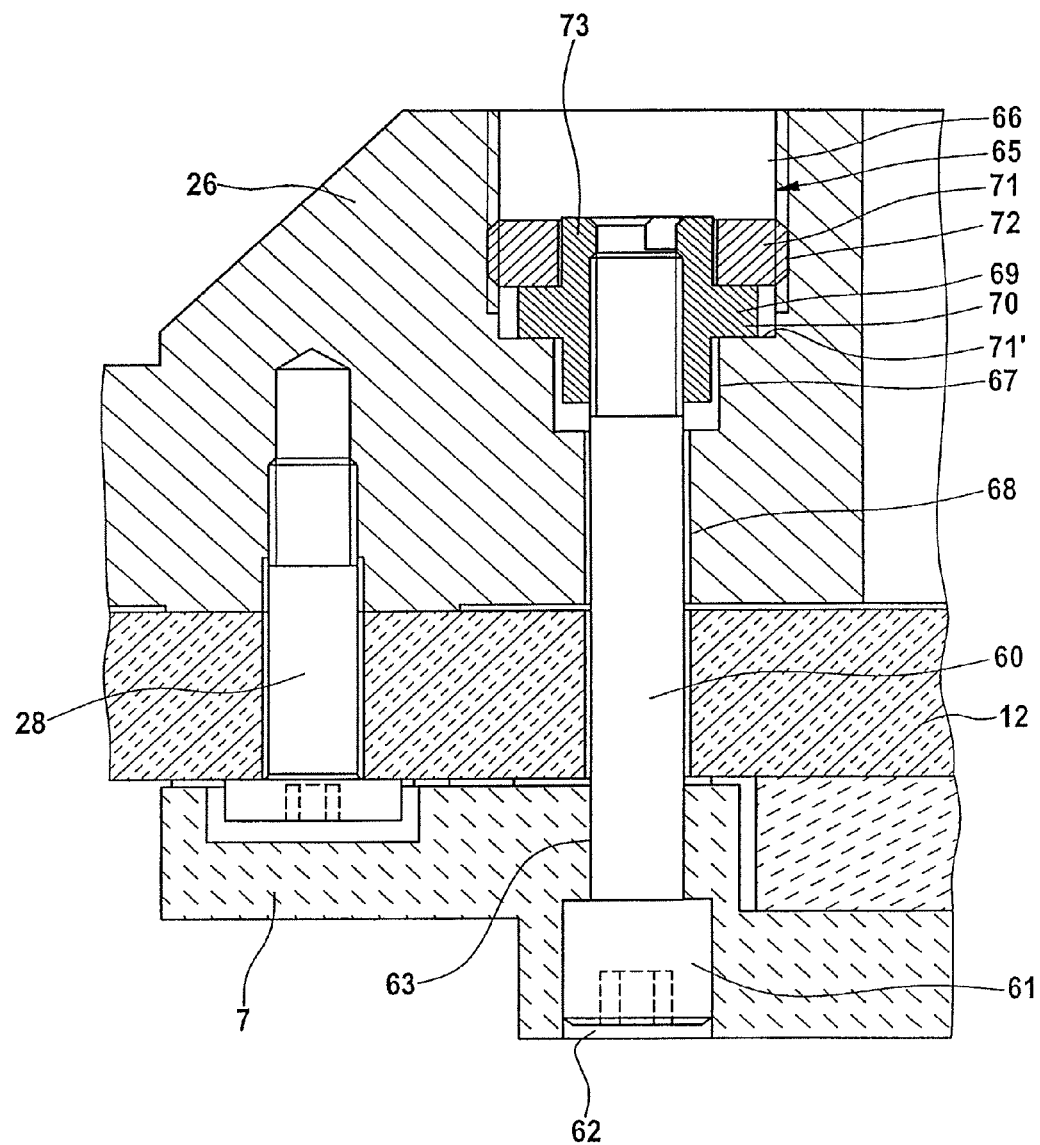
FIG. 7 shows a detail view of the testing apparatus of FIG. 6.
Figure 8:
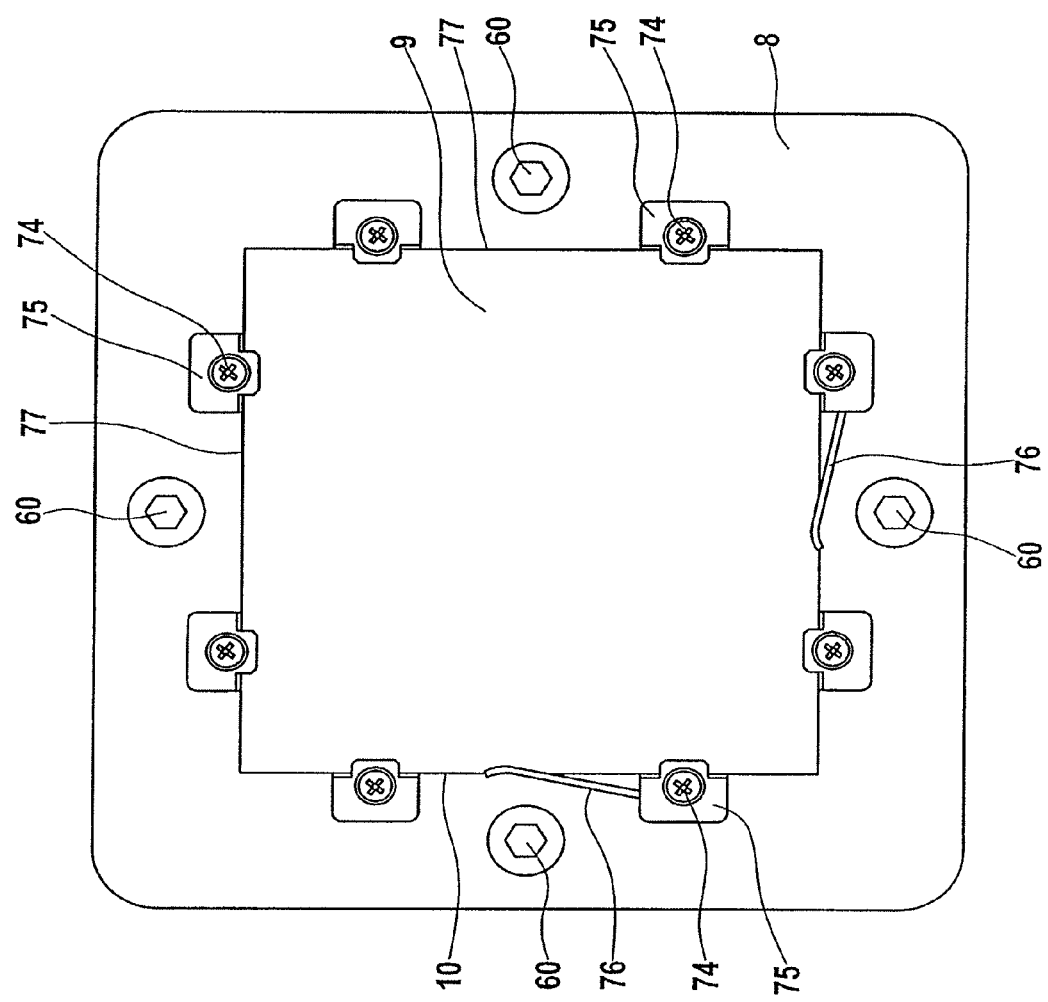
FIG. 8 shows a further detail view of the testing apparatus of FIG. 6.

FIGS. 6 to 8 concern a further exemplary embodiment of a testing apparatus. The description concerning the exemplary embodiment of FIGS. 1 to 5 also applies to this further exemplary embodiment and it is only differences between them that will be considered now. Contrary to the exemplary embodiment already described, the embodiment of FIGS. 6 to 8 has no tilt element. According to FIG. 6, which shows a section of the testing apparatus 1 according to the further exemplary embodiment, wherein the view in FIG. 6 is rotated through 180.degree. relative to the view of the other exemplary embodiment in FIG. 2, it can be seen that a plurality of spacers 30 in the form of mutually spaced threaded screws 60 is fastened onto the contact spacing converter 7. The threaded screws 60 have heads 61 which lie firmly in receptacles 62 of the contact spacing converter 7 by screwing the threaded screws 60 into threaded bores 63 of the contact spacing converter 7. The shafts 64 of the threaded screws 60 penetrate guide apertures 48 of the conductor substrate 12 with room to spare, and engage in receptacles 65 of the first stiffening device 26.

According to FIG. 7, each receptacle 65 has a section 66 of large diameter provided with an internal thread, a section 67 adjacent thereto of smaller diameter and without a thread, and a section 68 of yet smaller diameter and also without a thread. The section 68 has play relative to the shaft 64 of the associated threaded screw 60. Screwed onto the thread of the threaded screw 60 is a nut 69 which rests with a flange 70 against a step 71'. The step 71' is provided between the sections 66 and 67. Situated on the other side of the flange 70 is a screw ring 71 which has an external thread 72 which is screwed into the internal thread of the section 66. The interior of the screw ring 71 covers a connecting port 73 of the nut 69. In the screwed-on condition, the screw ring 71 presses the nut 69 against the step 71'.

It is clear from this that by screwing the respective nut 69 appropriately far onto the respective threaded screw 60, the contact spacing converter 7 can be adjusted with a relevant desired tilt relative to the conductor substrate 12, wherein by tightening the relevant screw ring 71, the respective nut position is secured.

It is also apparent from FIGS. 6 and 8 that—as distinct from the exemplary embodiment of FIGS. 1 to 5—the contact spacing conversion circuit 9 is not glued into a receptacle 10, but is laid into a receptacle 10 of the support 8 and is held by projecting clamping plates 75, which are fixed by holding screws 74. The clamping plates 75 project over the contact spacing conversion circuit 9. In order to preserve a reproducible position of the contact spacing conversion circuit 9 within the rectangular or square depression 10, clamping springs 76 are provided on two sides of the receptacle 10, said clamping springs 76 forcing the contact spacing conversion circuit 9 against opposing edges 77 of the receptacle 10, so that highly precise positioning is ensured.

This manner of positioning the contact spacing conversion circuit 9 can naturally also be provided in the exemplary embodiment of FIGS. 1 and 5. Naturally, it is also possible that the exemplary embodiment of FIGS. 6 to 8 has a glued-in contact spacing conversion circuit 9.

The structural height of the testing apparatus 1 in the exemplary embodiment of FIGS. 6 to 8 is smaller due to the lack of a tilt plate. This embodiment is also made more economical by dispensing with the tilt plate.

The above description of the preferred embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

What is claimed is:

1. An electrical testing apparatus for testing an electrical test sample, comprising: a conductor substrate electrically connected to a test head via a contact spacing converter, wherein the conductor substrate is mechanically connected to and stiffened by a first stiffening device;
   a plurality of spacers mechanically connected to the contact spacing converter and held on the first stiffening device by a tilt adjuster, the spacers being spaced apart from one another, penetrating the conductor substrate, being configured as threaded screws, wherein a shaft of each threaded screw penetrates a respective guide aperture of the conductor substrate with room to spare and engages in a respective receptacle of the first stiffening device, wherein each receptacle has a section of large diameter provided with an internal thread, an unthreaded section of smaller diameter adjacent the section of large diameter, and another unthreaded section of yet smaller diameter than the diameter of the section of smaller diameter, and wherein the section of yet smaller diameter has play relative to the shaft of an associated threaded screw;
   a nut screwed onto a thread of each threaded screw, each nut including a flange having a first side that rests against a step provided between a section of large diameter and a section of smaller diameter;
   a screw ring situated on a second side of each flange opposite the first side of the flange, the screw ring having an external thread which is screwed into the internal thread of the section of large diameter, wherein the screw ring presses the nut against the step in a screwed-on state.

2. An electrical testing apparatus according to claim 1, wherein the interior of the screw ring covers a connecting port of the nut.

3. An electrical testing apparatus according to claim 1, wherein the conductor substrate comprises first contact surfaces that are connected to countercontact surfaces of the contact spacing converter by a contacting device.

4. An electrical testing apparatus according to claim 3, wherein the contacting device compensates for an angular offset caused by a tilt adjustment between the conductor substrate and the contact spacing converter.

5. An electrical testing apparatus according to claim 3, wherein the contacting device is directly and firmly arranged on the contact spacing converter.

6. An electrical testing apparatus according to claim 1, wherein the contact spacing converter comprises second contact surfaces that are in electrical contact with one of contact probes, contact pins and buckling beams of the test head.

7. An electrical testing apparatus according to claim 1, wherein contact elements are firmly arranged on the contact spacing converter for physical electrical contacting of the test sample.

8. An electrical testing apparatus according to claim 1, further comprising a second stiffening device, wherein the first stiffening device is arranged on one side of the conductor substrate and the second stiffening device is arranged on the other side of the conductor substrate.

9. An electrical testing apparatus according to claim 8, wherein the contact spacing converter is allocated to the second stiffening device.

10. An electrical testing apparatus according to claim 8, wherein the second stiffening device has an opening in which the contact spacing converter is at least partially accommodated without physical contact.

11. An electrical testing apparatus according to claim 8, wherein one of the first and the second stiffening device is configured as a slab or both the first and the second stiffening device are configured as a slab.

12. An electrical testing apparatus according to claim 1, wherein the conductor substrate is configured as a printed circuit board.

13. An electrical testing apparatus according to claim 1, further comprising alignment devices, which align the conductor substrate laterally to the contact spacing converter.

* * * * *